(12) United States Patent
Lee et al.

(10) Patent No.: US 7,812,517 B2
(45) Date of Patent: Oct. 12, 2010

(54) ORGANIC ELECTROLUMINESCENT DEVICE AND METHOD OF MANUFACTURING THE SAME

(75) Inventors: Ho-nyeon Lee, Seongnam-si (KR); Sung-kee Kang, Seongnam-si (KR); Jung-woo Kim, Yongin-si (KR); Ick-hwan Ko, Seoul (KR); Young-tea Chun, Suwon-si (KR); Hong-shik Shim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 324 days.

(21) Appl. No.: 11/560,593

(22) Filed: Nov. 16, 2006

(65) Prior Publication Data
US 2007/0188081 A1  Aug. 16, 2007

(30) Foreign Application Priority Data
Feb. 11, 2006  (KR) ............... 10-2006-0013332

(51) Int. Cl.
*H05B 51/00* (2006.01)

(52) U.S. Cl. ...................................... 313/504

(58) Field of Classification Search ............... 313/504, 313/512
See application file for complete search history.

(56) References Cited

U.S. PATENT DOCUMENTS

| 5,276,381 A * | 1/1994 | Wakimoto et al. .......... 313/504 |
| 6,373,187 B1 * | 4/2002 | Nagayama et al. .......... 313/506 |
| 6,414,432 B1 * | 7/2002 | Hieda et al. ................. 313/506 |
| 6,737,187 B2 * | 5/2004 | Takada et al. ................ 429/56 |
| 2004/0201048 A1 * | 10/2004 | Seki et al. .................... 257/294 |

FOREIGN PATENT DOCUMENTS

JP        2000195668 A  *  7/2000

* cited by examiner

*Primary Examiner*—Toan Ton
*Assistant Examiner*—Hana S Featherly
(74) *Attorney, Agent, or Firm*—Cantor Colburn LLP

(57) ABSTRACT

An organic electroluminescent device having an improved structure includes; a duo-bank defining a unit pixel on a substrate, the duo-bank including a first bank and a second bank which are spaced apart from each other, and an organic luminescent material layer formed by inkjet printing a solution containing an organic luminescent material in the unit pixel and a gap between the first bank and the second bank.

12 Claims, 5 Drawing Sheets

ORGANIC ELECTROLUMINESCENT DEVICE AND METHOD OF MANUFACTURING THE SAME

This application claims priority to Korean Patent Application No. 10-2006-0013332, filed on Feb. 11, 2006, and all the benefits accruing therefrom under 35 U.S.C. §119, the contents of which in its entirety are herein incorporated by reference.

BACKGROUND OF THE INVENTION

1. Field of the Invention

The present invention relates to an organic electroluminescent ("EL") device, and more particularly, to an organic EL device having an improved structure for forming an organic material layer in a unit pixel to a uniform thickness by inkjet printing, and a method of manufacturing the organic EL device.

2. Description of the Related Art

The display market is rapidly growing owing to development and application of new products. Among various displays, a liquid crystal display ("LCD") is a common flat display because of its light weight and low-power consuming characteristics. It is predicted that the LCD will be in great demand in the market for a considerable time.

However, the LCD is not a self-luminescent device but rather a light-receiving device. Therefore, development of a new flat display that obviates the technical limitations and disadvantages of the LCD such as limited brightness, limited contrast, limited viewing angle, size, etc., is ongoing. An organic electroluminescent ("EL") device, a new type of flat display, has a good viewing angle and contrast when compared with the LCD since the organic EL device is self-luminescent. Further, since the organic EL device does not require a backlight, the organic EL device consumes less power and can be formed into a light and slim shape. Furthermore, the organic EL device has a fast response time and can be operated using a low voltage. In addition, since the organic EL device can be made from fewer parts spaced closer together, it has a good impact resistance and a wide operating temperature range. Perhaps most importantly, the organic EL can be manufactured at low cost. The organic EL device has a structure formed by an anode, a cathode, and an organic thin layer interposed between the anode and the cathode. The anode is formed of indium tin oxide ("ITO"), and the cathode is formed of a metal having a low work function. The organic thin layer has a thickness of about 100 nm to about 200 nm. Although the organic thin layer can be formed of a single material, generally, the organic thin layer is formed into a multiply layered structure layer using a plurality of organic materials. Further, the organic thin layer is doped with a fluorescent dye or a phosphorous dye to increase its radiating efficiency.

The organic EL device emits light when a hole (the absence of an electron in the valence band of an atom), injected from an anode, and an electron, injected by the cathode, combine to form an exciton. When the exciton de-excites it emits a photon with an energy corresponding to the energy difference between the highest occupied molecular orbital ("HOMO") and the lowest un-occupied molecular orbital ("LUMO"). When the exciton de-excites an emitting layer ("EML") it is more likely to emit a photon in the desired visible wavelength range.

Since the mobility of holes is different from that of electrons in an organic material, a hole transport layer ("HTL") and an electron transfer layer ("ETL") are used to effectively transfer holes and electrons to an EML. For this reason, the organic EL device is usually formed into a multiple thin layer structure.

When the densities of electrons and holes are balanced in the EML owing to the above-described structure, the radiating efficiency, or the percentage of hole and electron recombinations that result in the emission of a visible wavelength photon, of the organic EL increases. Further, since electrons injected from the cathode toward the EML are confined in the EML by an energy barrier existing at the interface between the HTL and EML, recombination efficiency of electrons and holes increases. The electrons become trapped in the EML where their recombination with a hole will be more likely to result in the emission of a visible wavelength photon. The energy barrier at the EML/HTL interface prevents electrons from traveling to the anode where their recombination with a hole would be less likely to result in emissive radiation.

Furthermore, a recombination region can be moved further away from the cathode than an exciton diffusion length (about 10 nm to about 20 nm) by adjusting the thickness of the ETL to about several tens of nanometers. In this case, extinction of excitons by the cathode can be prevented, thereby increasing radiating efficiency.

In some cases, a hole injection layer is additionally formed between the anode and the HTL using a conductive high-molecular weight material such as copper (II) pthalocyanine ("CuPc"), or other similar substances, so as to lower the energy barrier of hole injection. This means that holes may be injected using less energy. A material such as LiF may be formed between the cathode and the ETL to a thickness of about 0.5 nm to about 1 nm so as to improve electron injection. These layers thereby increase radiating efficiency and decrease a driving voltage of the organic EL device.

FIG. 1A is a schematic perspective view of a conventional organic EL device, and FIG. 1B is a cross-sectional view taken along line A-A' of FIG. 1A. Referring to FIGS. 1A and 1B, the conventional organic EL device includes a bank 4 defining a plurality of unit pixels 3 on a substrate 2, and an organic luminescent layer 6 formed in the unit pixels 3 by inkjet printing.

In manufacturing the conventional organic EL device using inkjet printing, the bank 4 is formed to confine applied organic material ink in the unit pixels 3. The bank 4 prevents overflowing of the applied organic material ink from one unit pixel 3 to neighboring unit pixels 3. In inkjet printing, ink is applied to fill the unit pixels 3 and contact the bank 4. After that, when the volume of the ink reduces as solvent of the ink evaporates, the ink filled in each of the unit pixels 3 is deformed by surface tension, such that the outer region of the ink becomes thinner. Further, the ink sticks to an inner surface of the bank 4 by an attractive force between the ink and the inner surface of the bank 4. Therefore, as shown in FIG. 1B, the thickness of the organic luminescent layer 6 in the unit pixel 3 decreases from the bank 4 and then increases rapidly toward a central area of the organic luminescent layer 6 then decreases rapidly moving away from a central area of the organic luminescent layer 6 only to increase again as it approaches the bank 4. The resulting structure thus has a thick central area surrounded by a thin ring, which is in turn encompassed by a slightly thicker ring adjacent to the bank 4. The thinner region of the ink filled in the pixel 3 causes problems such as an inter-layer short circuit. Further, an electric field will tend to concentrate on the thinner region once a common electrode is formed on the organic luminescent layer. In such an organic luminescent layer 6 most of the current will pass through the one thin region which will wear out more rapidly than if the current were instead passed throughout the organic luminescent layer 6, thereby decreasing the life span of the entire organic EL device.

BRIEF SUMMARY OF THE INVENTION

The present invention provides an organic electroluminescent device having an improved structure for forming an organic material layer in a unit pixel to a uniform thickness by inkjet printing, and a method of manufacturing the organic electroluminescent device.

According to an exemplary embodiment of the present invention, there is provided an organic EL device including; a duo-bank defining a unit pixel on a substrate, the duo-bank including a first bank and a second bank which are spaced apart from each other; and an organic luminescent material layer formed by inkjet printing in the unit pixel and a gap between the first bank and the second bank.

According to an exemplary embodiment, the first bank and the second bank may be spaced about 1 µm to about 20 µm apart.

According to an exemplary embodiment, the first bank may be located interior to the second bank and may have a smaller width than the second bank.

According to an exemplary embodiment, the organic electroluminescent device may further include; an anode layer formed under the organic luminescent material layer; and a cathode layer formed on the organic luminescent material layer.

According to an exemplary embodiment, the organic luminescent material layer may have a single layered structure or a multiple layered structure.

According to an exemplary embodiment the multiple layered structure may include a hole transport layer and an emitting layer which is stacked on the hole transport layer.

According to another exemplary embodiment of the present invention, there is provided a method of manufacturing an organic electroluminescent device, the method including; forming an anode layer on a substrate, forming an insulating layer on the anode layer, forming a duo-bank to define a unit pixel on the anode layer by patterning the insulating layer, the duo-bank including a first bank and a second bank which are spaced apart from each other; forming an organic luminescent material layer in the unit pixel and a gap between the first bank and the second bank, and forming a cathode layer on the organic luminescent material layer.

According to an exemplary embodiment, the first bank and the second bank may be formed to be spaced about 1 µm to about 20 µm apart.

According to an exemplary embodiment, the first bank may be formed to be located interior to the second bank and may have a smaller width than the second bank.

According to an exemplary embodiment, the organic luminescent material layer may be formed to have a single layered structure or a multiple layered structure.

According to an exemplary embodiment the multiple layered structure is formed to include a hole transport layer and an emitting layer which is sequentially stacked on the hole transport layer.

According to the present invention, in manufacturing the organic electroluminescent device by inkjet printing, the problem of the organic luminescent material layer becoming thinner at a side of the bank can be alleviated, so that the organic luminescent material layer can be formed in the unit pixel to a uniform thickness.

BRIEF DESCRIPTION OF THE DRAWINGS

The above and other aspects, features and advantages of the present invention will become more apparent by describing in more detail exemplary embodiments thereof with reference to the attached drawings in which.

DETAILED DESCRIPTION OF THE INVENTION

Figure 1A:
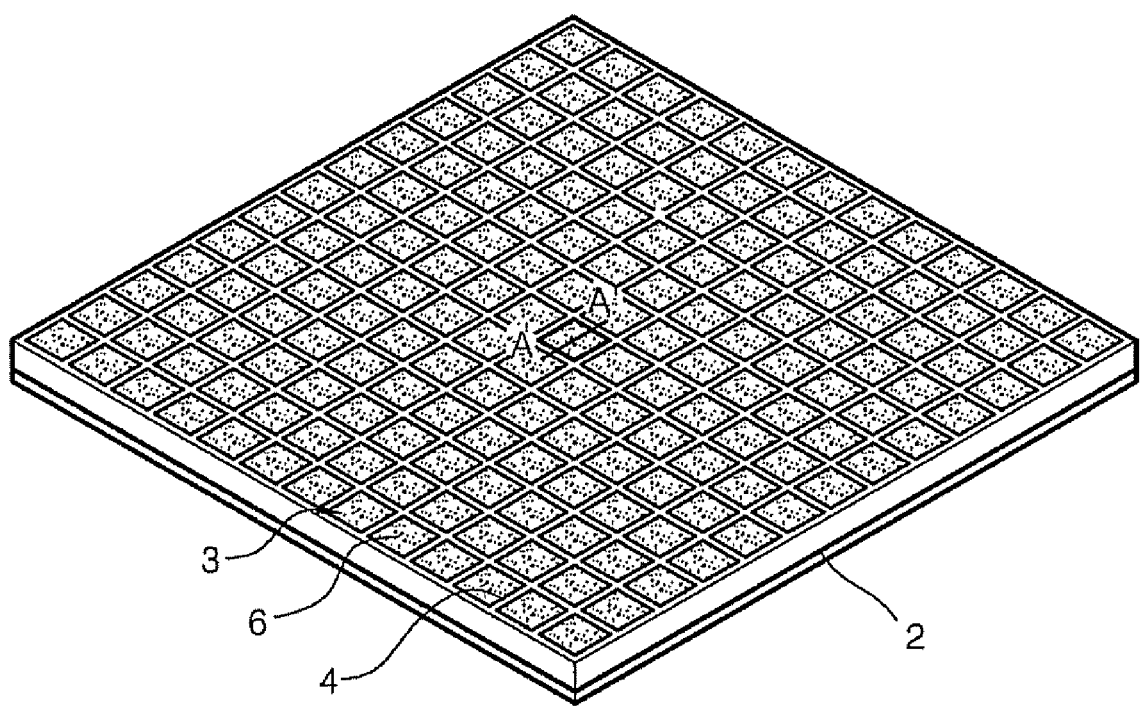
FIG. 1A is a schematic perspective view of a conventional organic EL device.
Figure 1B:
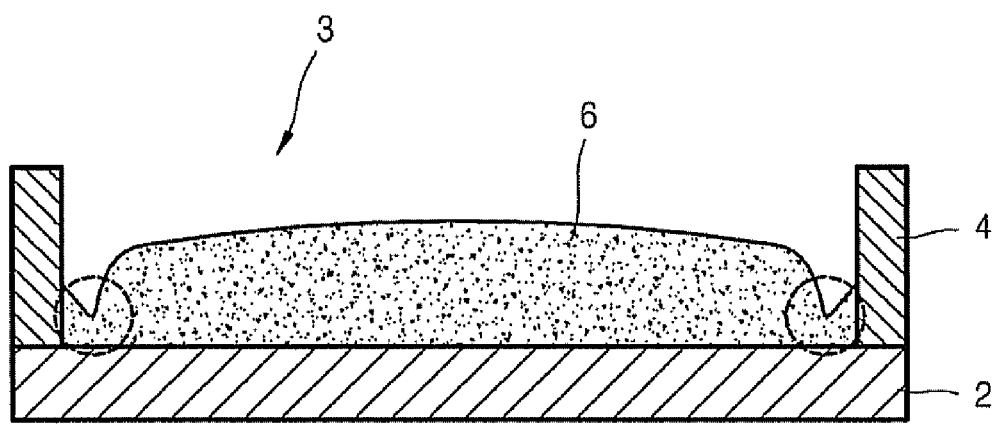
FIG. 1B is a cross-sectional view taken along line A-A' of FIG. 1A.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2:
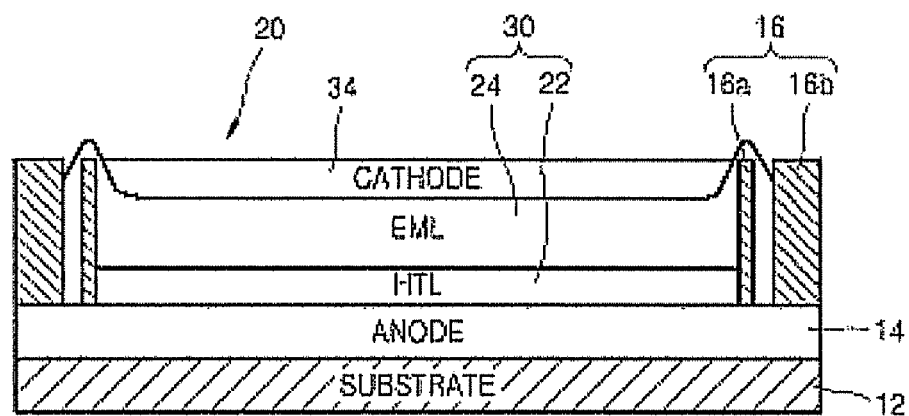
FIG. 2 is a schematic cross-sectional view of an exemplary embodiment of an organic EL device according to the present invention.

FIG. 2 is a schematic cross-sectional view of an exemplary embodiment of an organic EL device according to an exemplary embodiment of the present invention.

Referring to FIG. 2, the organic EL device includes a duo-bank 16 dividing a substrate 12 to define a unit pixel 20 and an organic luminescent material layer 30 formed in the unit pixel 20 by inkjet printing. An anode layer 14 and a cathode layer 34 are formed on a lower surface and a top surface of the organic luminescent material layer 30, respectively.

The anode layer 14 is formed of a transparent electrode material such as indium tin oxide ("ITO"), and the cathode layer 34 is formed of a metal having a low work function such as Ca, Mg, Al, Ag, Ni, Au, Cu, Mg/Ag, and alloys thereof.

Exemplary embodiments of the organic luminescent material layer 30 may be formed with a single layer structure or a multiple layer structure. According to the present exemplary embodiment, the multiple layer structure may include a hole transport layer ("HTL") 22 and an emitting layer ("EML") 24 that are sequentially stacked on the anode 14.

The EML 24 emits light by recombining electrons and holes supplied from the cathode layer 34 and the anode layer 14, respectively. Since the EML 24 can emit light having various colors according to the intrinsic wavelength of an organic material used in its formation, the composition ratio of a host and a dopant is adjusted according to the radiating characteristic of a desired device.

Generally, the EML 24 is formed by mixing various kinds of hosts and dopants to maximize the radiating efficiency of the EML 24 and adjust the chromaticity of light emitted by the EML 24. In manufacturing an organic EL device by inkjet printing, materials and method used for the EML are well-known. Thus, detail descriptions of the material and method will be omitted.

The HTL 22 is formed for smoothly injecting holes into the EML 24. Exemplary embodiments of the HTL 22 may be formed from N,N'-bis(1-naphthyl)-N,N'-diphenyl-1,1'-biphenyl-4,4'-diamine ("NPB"), or N,N'-diphenyl-N,N'-(3-methylphenyl)-1,1'-biphenyl-4,4'-diamine ("TPD").

In the organic EL device, when a predetermined voltage (also known as the turn-on voltage) is applied between the cathode layer 34 and the anode layer 14, electrons and holes are injected into the EML 24. Organic molecules of the EML 24 are excited by recombination energy of the injected electrons and holes to generate excitons. The excitons de-excite to a ground state through many paths, and in this process, light is emitted (electroluminescence) as described above with reference to the HOMO and LUMO.

In the present invention, the duo-bank 16 has a dual bank structure formed by a first bank 16a and a second bank 16b that are spaced apart about 1 μm to about 20 μm from each other. The first bank 16a is located interior to the second bank 16b. In one exemplary embodiment the first bank 16a may be narrower in width than the second bank 16b. The first bank 16a defines the unit pixel 20, and the second bank 16b may prevent ink filled in the unit pixel 20 from overflowing to another unit pixel. In essence, a gap between the first bank 16a and the second bank 16b may serve as a reservoir to store ink from the unit pixel 20.

In manufacturing the organic EL device with the duo-bank 16 having the double bank structure by inkjet printing, organic ink is filled in the gap between the first and second banks 16a and 16b as well as in the unit pixel 20. Since the gap between the first bank 16a and the second bank 16b is narrow, a relatively large attractive adhesive force is generated between the organic ink and the first and second banks 16a and 16b.

Generally, the molecules of the organic ink are pulled toward the center of the unit pixel 20 by an attractive cohesive force between the ink molecules as the volume of the organic ink is reduced by evaporation of the solvent of the organic ink. However, the organic ink in the gap between the first and second banks 16a and 16b is not pulled toward the inside of the pixel 20 due to the attractive force between the organic ink and the first and second banks 16a and 16b.

Further, the organic ink in the unit pixel 20 tends to cohere together with the organic ink remaining in the gap between the first and second banks 16a and 16b. The cohesive force between the organic ink in the two regions acts on the organic ink filled on the outer edge of the unit pixel 20 near the first bank 16a. As a result, the cohesive force between the ink in the edge of the unit pixel and the ink in the gap between the first and second banks 16a and 16b counteracts the cohesive force of the ink molecules in the center region that pulls the organic ink filled on the outer edge of the unit pixel 20 in an inward direction. This counteracting force thereby prevents the organic ink filled in the unit pixel 20 from becoming thinner toward the inner surface of the first bank 16a. Thus, the organic ink can be kept at a uniform thickness. Therefore, in manufacturing the organic EL device using the duo-bank 16, organic ink can be filled in the unit pixel 20 to a near uniform thickness throughout most of the EML. The cohesive force of the ink causes the ink around the edges of the unit pixel 20 to be slightly raised as it meets the ink stored in the gap between the first bank 16a and the second bank 16b. Consequently, according to the present invention, problems associated with the conventional organic EL device, such as an inter-layer short circuit or electrical field concentration at a thinner region of the organic material layer, can be obviated, and thus the lifetime of the organic EL device may be effectively increased.

Figure 3A:
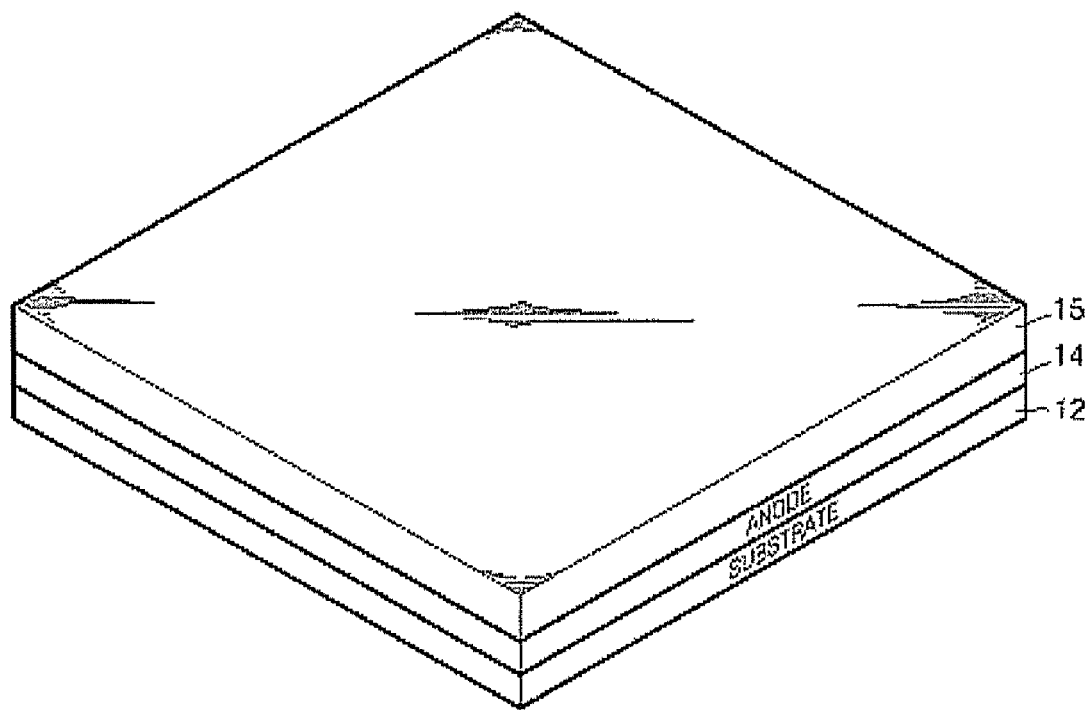
FIGS. 3A and 3B are schematic perspective views of an exemplary embodiment of a method of manufacturing an organic EL device according to the present invention.
Figure 3B:
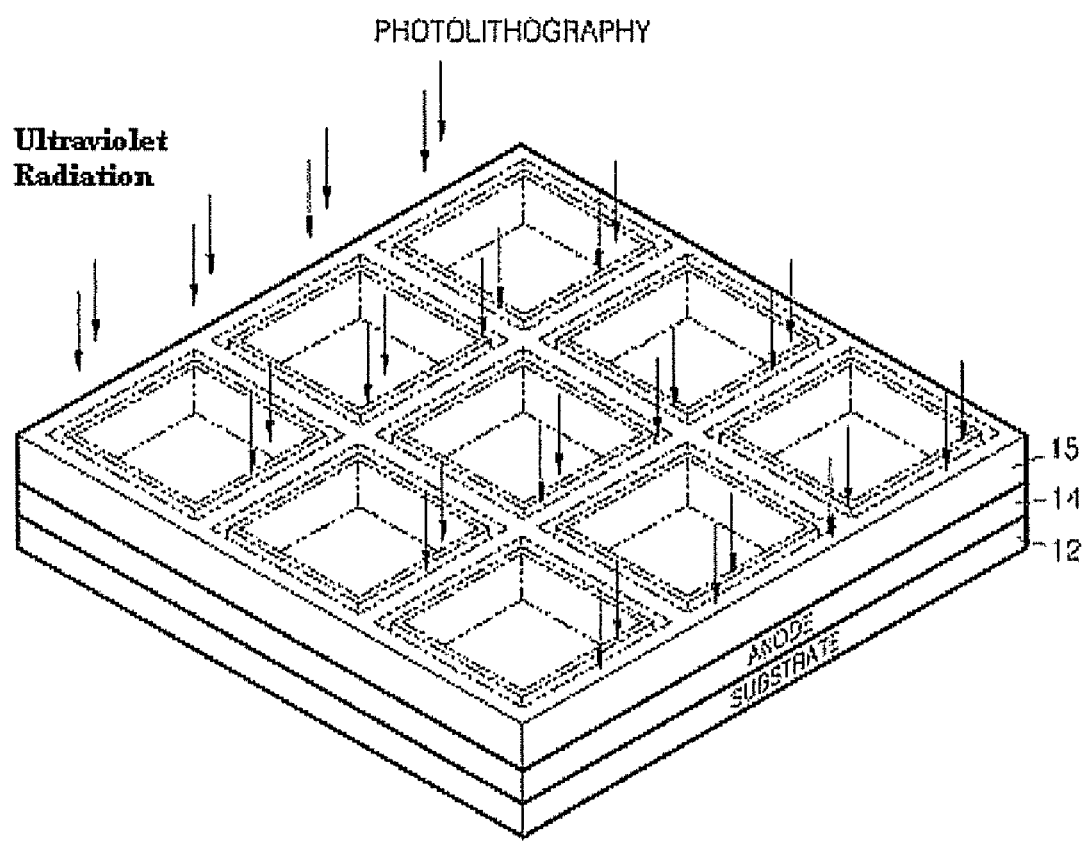
Figure 3C:
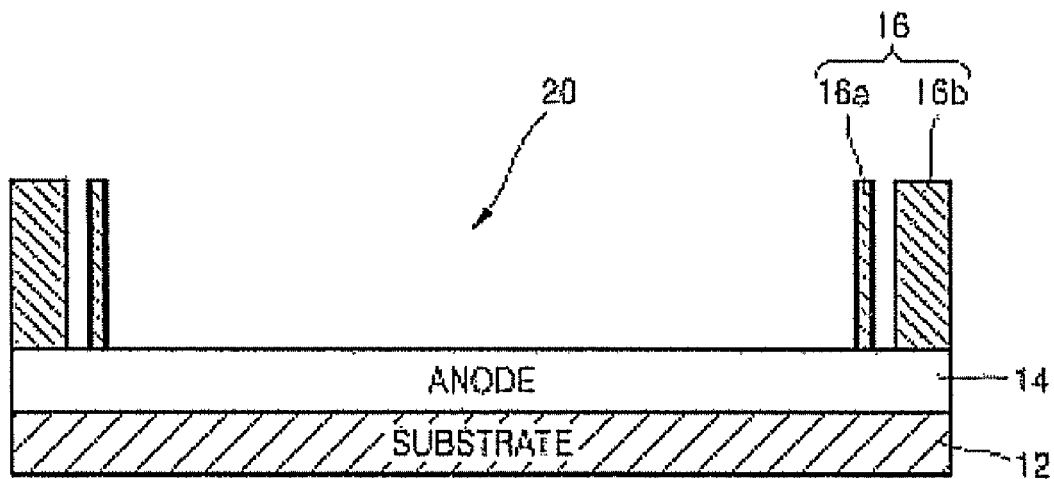
FIGS. 3C through 3E are cross-sectional views showing an exemplary embodiment of a method of manufacturing an organic EL device according to an embodiment of the present invention.
Figure 3D:
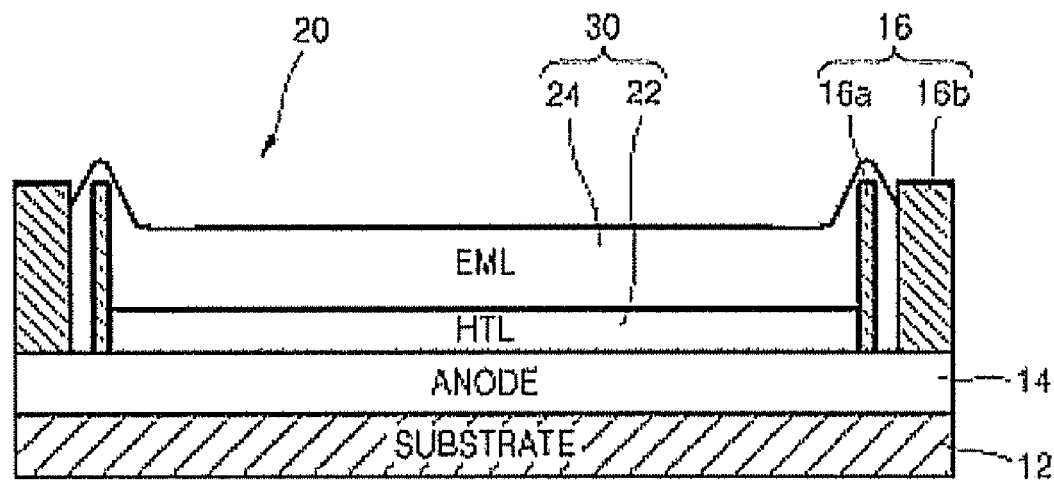
Figure 3E:
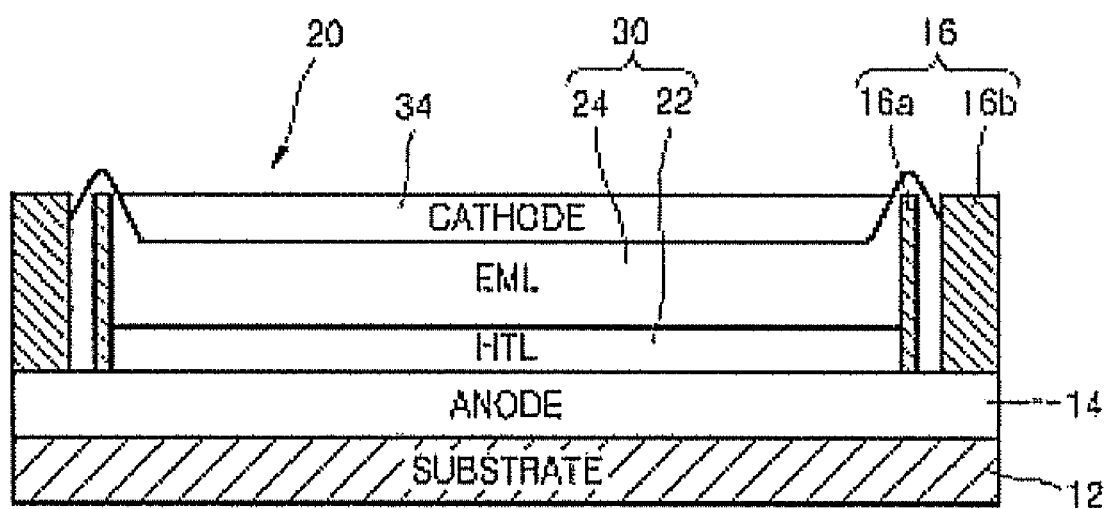

FIGS. 3A and 3B are schematic perspective views of an exemplary embodiment of a method of manufacturing an organic EL device according to the present invention and FIGS. 3C through 3E are cross-sectional views of the same exemplary embodiment.

Referring to FIG. 3A, an anode layer 14 and an insulating layer 15 are sequentially formed on a substrate 12. Exemplary embodiments of the substrate 12 may be made of glass, plastic, sapphire, or a may be formed of a flexible material. Exemplary embodiments of the anode layer 14 may be formed of a transparent material such as ITO. Exemplary embodiments of the insulating layer 15 may be formed of an organic insulating material such as silicon oxide ("$SiO_2$"), silicon nitride ("$Si_3N_4$"), or other insulating materials. Exemplary embodiments of the anode layer 14 and the insulating layer 15 may be formed by thin film deposition such as vapor deposition and spin coating or other techniques which are generally used in manufacturing a semiconductor or an organic EL device. The thin film deposition method is well-known to those of skill in the related art. Thus, description of the thin film deposition will be omitted.

Referring to FIG. 3B, the insulating layer 15 is patterned to form a duo-bank 16 defining unit pixels 20. The duo-bank 16 has a double bank structure formed by a first bank 16a and a second bank 16b that are spaced apart from each other. The insulating layer 15 may be patterned by photolithography. The photolithography may include exposing to ultraviolet radiation through a mask (not shown), developing, and etching. FIG. 3B shows the insulating layer being exposed to ultraviolet light, the dotted lines showing the portions to be removed through the developing and etching process. A cross-sectional view of the resulting unit pixel 20 formed from these processes is shown in FIG. 3C. In one exemplary embodiment the first and second banks 16a and 16b may be spaced about 1 μm to about 20 μm apart. The first bank 16a is located interior to the second bank 16b. According to one exemplary embodiment the width of the first bank 16a may be smaller than that of the second bank 16b. The first bank 16a defines the borders of the unit pixel 20. When ink is filled in the unit pixel 20, the second bank 16b may prevent overflowing of the ink to neighboring unit pixels.

Referring to FIG. 3D, an organic luminescent material layer 30 is formed in the unit pixel 20 and a gap between the first and second banks 16a and 16b by inkjet printing. The organic luminescent material layer 30 may be formed into a single layered structure or a multiple layered structure. In the latter case, as shown in FIG. 3D, the organic luminescent material layer 30 may include an HTL 22 and an EML 24 that are sequentially stacked on the anode 14.

The color of light can be changed variously according to the intrinsic frequency of a material used for forming the EML 24. A composition ratio of a host and dopant are properly adjusted based on desired electrical and light emitting characteristics of the organic EL device to be formed. Generally, the EML 24 is formed by mixing various kinds of hosts and dopants to maximize radiating efficiency of the EML 24 and adjust the chromaticity of light emitted by the EML 24. In manufacturing an organic EL device by inkjet printing, materials and method used for the EML are well-known. Thus, detail descriptions of the material and method will be omitted.

Exemplary embodiments of the HTL 22 may be formed of N,N'-bis(1-naphthyl)-N,N'-diphenyl-1,1'-biphenyl-4,4'-diamine ("NPB"), or N,N'-diphenyl-N,N'-(3-methylphenyl)-1, 1'-biphenyl-4,4'-diamine ("TPD").

In manufacturing the organic EL device with the duo-bank 16 having the double bank structure by inkjet printing, organic ink is additionally filled in the gap between the first bank 16a and the second bank 16b. Since the organic ink filled in the gap tends to cohere together with organic ink filled in the unit pixel 20, as described above, a cohesive force is generated. The cohesive force acts on the organic ink filled near an inner surface of the first bank 16a in a direction away from the center of the unit pixel 20. As a result, the cohesive force acts against the attractive force of the ink molecules which pull the organic ink filled near the inner surface of the first bank 16a in a direction toward the center of the unit pixel 20, thereby preventing the organic ink filled in the unit pixel 20 from thinning around the inner surface of the first bank 16a. Thus, the organic ink can be kept at a uniform thickness. Therefore, in manufacturing the organic EL device using the duo-bank 16, the organic ink can be filled in the unit pixel 20 to a uniform thickness.

Referring to FIG. 3E, an exemplary embodiment of a cathode layer 34 is formed by printing or vapour-depositing a conductive ink material on the organic luminescent material layer 30. Exemplary embodiments of the cathode layer 34 may be formed using a metal having a low work function such as Ca, Mg, Al, Ag, Ni, Au, Cu, Mg/Ag, and alloys thereof. The conductive ink material may be a metal-ink material such as Ag-ink, Ni-ink, Au-ink, and Cu-ink.

According to the present invention, in manufacturing the organic EL device by inkjet printing, the problem of the organic luminescent material layer 30 becoming thinner at a side of the bank 16 can be reduced or effectively prevented, so that the organic luminescent material layer 30 can be formed in the unit pixel 20 to a uniform thickness. Consequently, the problems of the conventional organic EL device, such as an inter-layer short circuit or electrical field concentration at a thinner region of the organic material layer, may be obviated, and thus the lifetime of the organic EL device may be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent device comprising:
    a duo-bank defining a unit pixel on a substrate, the duo-bank including a first bank entirely surrounding the unit pixel, a second bank entirely surrounding the first bank and the same unit pixel, and a gap between the first bank and the second bank, wherein the first bank and the second bank are spaced apart from each other; and
    an organic luminescent material layer formed by inkjet printing in the unit pixel and the gap between the first bank and the second bank.

2. The organic electroluminescent device of claim 1, wherein the first bank and the second bank are spaced about 1 μm to about 20 μm apart.

3. The organic electroluminescent device of claim 1, further comprising:
    an anode layer formed under the organic luminescent material layer; and
    a cathode layer formed on the organic luminescent material layer.

4. The organic electroluminescent device of claim 1, wherein the organic luminescent material layer has a single layered structure or a multiple layered structure.

5. The organic electroluminescent device of claim 1, wherein the organic luminescent material has a multiple layered structure and the multiple layered structure comprises a hole transport layer and an emitting layer which is stacked on the hole transport layer.

6. An organic electroluminescent device comprising:
   a duo-bank defining a unit pixel on a substrate, the duo-bank including a first bank surrounding the unit pixel, a second bank surrounding the first bank and the same unit pixel, and a gap between the first bank and the second bank, wherein the first bank and the second bank are spaced apart from each other; and
   an organic luminescent material layer formed by inkjet printing in the unit pixel and the gap between the first bank and the second bank, wherein the first bank is located interior to the second bank and has a smaller width than the second bank.

7. A method of manufacturing an organic electroluminescent device, comprising:
   forming an anode layer on a substrate;
   forming an insulating layer on the anode layer;
   forming a duo-bank to define a unit pixel on the anode layer by patterning the insulating layer, the duo-bank including a first bank entirely surrounding the unit pixel, a second bank entirely surrounding the first bank and the same unit pixel and a gap between the first bank and the second bank, wherein the first bank and the second bank are spaced apart from each other;
   forming an organic luminescent material layer in the unit pixel and the gap between the first bank and the second bank; and
   forming a cathode layer on the organic luminescent material layer.

8. The method of claim 7, wherein the first bank and the second bank are formed to be spaced about 1 µm to about 20 µm apart.

9. The method of claim 7, wherein the organic luminescent material layer is formed to have a single layered structure or a multiple layered structure.

10. The method of claim 7, wherein the organic luminescent material layer is formed to have a multiple layered structure and the multiple layered structure is formed to comprise a hole transport layer and an emitting layer which is stacked on the hole transport layer.

11. A method of manufacturing an organic electroluminescent device, comprising:
    forming an anode layer on a substrate;
    forming an insulating layer on the anode layer;
    forming a duo-bank to define a unit pixel on anode the layer by patterning the insulating layer, the duo-bank including a first bank surrounding the unit pixel a second bank surrounding the first bank and the same unit pixel and a gap between the first bank and the second bank, wherein the first bank and the second bank are spaced apart from each other;
    forming an organic luminescent material layer in the unit pixel and the gap between the first bank and the second bank; and
    forming a cathode layer on the organic luminescent material layer, wherein the first bank is formed to be located interior to the second bank and have a smaller width than the second bank.

12. An organic electroluminescent device comprising:
    a duo-bank defining a unit pixel on a substrate, the duo-bank including a concentric bank structure having a first bank entirely surrounding the unit pixel and a second bank entirely surrounding the same unit pixel and disposed interior to the first bank, wherein the first bank and the second bank are spaced apart from each other and form a gap therebetween; and
    an organic luminescent material layer formed by inkjet printing in the unit pixel and the gap between the first bank and the second bank.

* * * * *